United States Patent
Vinciarelli et al.

(10) Patent No.: US 10,284,106 B1
(45) Date of Patent: May 7, 2019

(54) POWER ADAPTER

(71) Applicant: VLT, Inc., Andover, MA (US)

(72) Inventors: Patrizio Vinciarelli, Boston, MA (US); Andrew T. D'Amico, Beverly Hills, CA (US)

(73) Assignee: VLT, Inc., Andover, MA (US)

( * ) Notice: Subject to any disclaimer, the term of this patent is extended or adjusted under 35 U.S.C. 154(b) by 0 days.

(21) Appl. No.: 15/174,083

(22) Filed: Jun. 6, 2016

Related U.S. Application Data

(60) Provisional application No. 62/171,770, filed on Jun. 5, 2015.

(51) Int. Cl.
*H05K 5/00* (2006.01)
*H02M 7/04* (2006.01)
*H02M 7/00* (2006.01)
*H05K 5/02* (2006.01)
(Continued)

(52) U.S. Cl.
CPC .............. *H02M 7/04* (2013.01); *H01R 31/06* (2013.01); *H02M 7/003* (2013.01); *H05K 5/0247* (2013.01); *H05K 7/209* (2013.01); *H05K 7/20436* (2013.01)

(58) Field of Classification Search
None
See application file for complete search history.

(56) References Cited

U.S. PATENT DOCUMENTS 3,484,864 A    12/1969   Bernstein et al.
3,833,821 A *  9/1974    Weaver ............... H02M 5/2573
                                              307/150
(Continued)

OTHER PUBLICATIONS

Vinciarelli et al., "Power Distribution Architecture with Series-Connected Bus Converter", U.S. Appl. No. 13/933,252, filed Jul. 2, 2013; 31 pages.
(Continued)

*Primary Examiner* — Courtney L Smith
(74) *Attorney, Agent, or Firm* — Fish & Richardson P.C.

(57) ABSTRACT

An efficient, high density, inline converter module includes a power conversion circuit and an input wiring harness for connecting the input of the power circuit to a unipolar source. A second wiring harness or electrical connectors may be provided for connecting the output of the power conversion circuit to a load. Connections between a wiring harness and the power conversion circuit may comprise conductive contacts, configured to distribute heat. The power circuit may be over molded to provide electrical insulation and efficient heat transfer to external ambient air. A DC transformer based inline converter module may be used in AC adapter, vehicular, and power system architectures. An input connector for connecting the input wiring harness to the input source may be provided. In some embodiments the input source may be an AC source and the input connector may comprise a rectifier for delivering a rectified, unipolar, voltage to the input of the power conversion assembly via an input wiring harness. By separating the rectifier from the power conversion assembly, the power conversion assembly may be packaged into a smaller volume than would be required if the rectifier, and its associated heat loss, were included in the power conversion assembly.

50 Claims, 11 Drawing Sheets

(51) Int. Cl.
*H05K 7/20* (2006.01)
*H01R 31/06* (2006.01)

(56) References Cited

U.S. PATENT DOCUMENTS

| | | | | |
|---|---|---|---|---|
| 3,918,084 | A * | 11/1975 | Schierz | H01L 23/473 165/80.4 |
| 5,353,001 | A | 10/1994 | Meinel et al. | |
| 6,788,033 | B2 | 9/2004 | Vinciarelli | |
| 6,912,123 | B2 * | 6/2005 | Sakai | H02J 9/06 307/64 |
| 6,930,893 | B2 | 8/2005 | Vinciarelli | |
| 6,984,965 | B2 * | 1/2006 | Vinciarelli | H02J 1/102 323/266 |
| 7,061,212 | B2 * | 6/2006 | Phadke | H02M 1/4225 323/222 |
| 7,145,786 | B2 | 12/2006 | Vinciarelli | |
| 7,154,250 | B2 | 12/2006 | Vinciarelli | |
| 7,202,646 | B2 | 4/2007 | Vinciarelli | |
| 7,212,419 | B2 | 5/2007 | Vinciarell | |
| 7,450,388 | B2 * | 11/2008 | Beihoff | B60L 11/12 361/679.48 |
| 7,529,110 | B1 * | 5/2009 | Haines | H02M 1/10 363/65 |
| 7,548,441 | B2 | 6/2009 | Vinciarelli | |
| 7,910,834 | B2 * | 3/2011 | McGinley | H02J 9/005 174/112 |
| 7,940,540 | B2 | 5/2011 | Vinciarelli | |
| 8,502,096 | B2 | 8/2013 | Lee | |
| 8,966,747 | B2 | 3/2015 | Vinciarelli et al. | |
| 2011/0103119 | A1 * | 5/2011 | Sharifipour | H05K 7/20463 363/141 |

OTHER PUBLICATIONS

U.S. Appl. No. 13/933,252, Vinciarelli et al., filed Jul. 2, 2013.
U.S. Appl. No. 14/731,287, Vinciarelli et al, filed Jun. 4, 2015.
Tan, D.F.D., "Intermediate Bus Architectures: A Practical Review," Proceedings of the 25th International Symposium on Power Semiconductor Devices & ICs (ISPSD), pp. 19-22, May 26-30, 2013.
Miftakhutdinov, R.; Sheng, L.; Liang, J.; Wiggenhorn, J.; Huang, H., "Advanced Control Circuit for Intermediate Bus Converter," Applied Power Electronics Conference and Exposition, pp. 1515-1521, Feb. 24-28, 2008.
Abe, S.; Ninomiya, T.; Hirokawa, M., "Optimal Design of Bus Converter in On-Board Distributed Power Architecture," The 7th International Conference on Power Electronics, pp. 252-256, Oct. 22-26, 2007.
Salato, M., "The Sine Amplitude Converter™ Topology Provides Superior Efficiency and Power Density in Intermediate Bus Architecture Applications," Vicor White Paper, Jun. 2011.

* cited by examiner

POWER ADAPTER

CROSS REFERENCE TO RELATED APPLICATION

This application claims priority to U.S. Provisional Application 62/171,770, filed on Jun. 5, 2015, which is incorporated herein by reference in its entirety.

TECHNICAL FIELD

This invention relates to the field of electrical power conversion. More particularly it relates to design and packaging of power adapters for delivering power from an AC utility source, vehicle power system, or within a power system to an electronic or other load.

BACKGROUND

Many products are designed to receive electrical power from power adapters that accept a voltage from an available primary power source, such as, e.g., an AC utility line input or a 12V automobile electrical system, and provide a product-specific DC output voltage. Some power adapters may use a connector and a cable (e.g., a standard AC utility plug and a line cord) to connect the primary power source to the input of a power converter, and another cable and product-specific connector to connect the output of the power converter to the device to be powered. The power adapter may provide a regulated output voltage.

A plug apparatus for connecting to a standard AC utility socket, and which contains a battery charger within the plug apparatus, is described in Meinel et al, Hybrid Integrated Circuit Transformer, U.S. Pat. No. 5,353,001, issued Oct. 4, 1994. A plug apparatus for connecting to a standard AC utility socket, which contains a rectifier within the plug apparatus, is described in Lee, Power Adapter, U.S. Pat. No. 8,502,096, issued Aug. 6, 2013. A connector comprising a rectifier within the connector shell is described in Bernstein et al, Combined Connector and Rectifier, U.S. Pat. No. 3,484,864, issued Dec. 16, 1969.

SUMMARY

In a general aspect, an apparatus includes: a first power conversion module including a module body having an input opening adapted to accommodate an electrical connection to an input of the first power conversion module, an output opening adapted to accommodate an electrical connection to an output of the first power conversion module, and an internal space; in which the first power conversion module includes circuitry contained in the internal space and adapted to convert power received from the input at an input voltage, Vin, for delivery at the output at a unipolar output voltage, Vo, via a transformer at an essentially fixed voltage transformation ratio, K=Vo/Vin. The first power conversion module is adapted to be used as part of a wire harness to provide voltage transformation, galvanic isolation, or both in-line between the input through the input opening and the output through the output opening.

Implementations of the apparatus can include one or more of the following features. In some examples, the input opening can be adapted to accommodate a cable and the apparatus can further include a first cable routed through the input opening and electrically connected to the input of the first power conversion module, the output opening can include an electrical connector having terminals connected to the output, and the apparatus can be adapted to be used at an end of a wire harness to provide voltage transformation, galvanic isolation, or both in-line between the first cable and the connector.

In some examples, the input opening can include an electrical connector having terminals connected to the input, the output opening can be adapted to accommodate a cable, the apparatus can further include a first cable routed through the output opening and electrically connected to the output of the first power conversion module, and the apparatus can be adapted to be used at an end of a wire harness to provide voltage transformation, galvanic isolation, or both in-line between the first cable and the connector.

In some examples, the input opening and output opening can each include an electrical connector having terminals connected to its respective input or output, and the apparatus can be adapted to be used at an end of a wire harness to provide voltage transformation, galvanic isolation, or both in-line between the input connector and the output connector.

In some examples, the input opening can be adapted to accommodate a cable and the apparatus can further include a first cable routed through the input opening and electrically connected to the input of the first power conversion module; the output opening can be adapted to accommodate a cable and the apparatus can further include a second cable routed through the output opening and electrically connected to the output of the first power conversion module; and the apparatus can be adapted to be used in a wire harness to provide voltage transformation, galvanic isolation, or both in-line between the first cable and the second cable.

The apparatus can further include a second power conversion module including a module body having an input opening adapted to accommodate an electrical connection to an input of the second power conversion module, an output opening adapted to accommodate an electrical connection to an output of the second power conversion module, and an internal space; the second power conversion module can include circuitry contained in the internal space and adapted to convert power received from the input at an input voltage, Vin, for delivery at the output at a unipolar output voltage, Vo, via a transformer at an essentially fixed voltage transformation ratio, K=Vo/Vin. The apparatus can further include a first cable having a first end electrically connected to the output of the first power conversion module and a second end electrically connected to the input of the second power conversion module; in which the apparatus can be adapted to be used as part of a wire harness to provide voltage transformation, galvanic isolation, or both in-line between the input opening of the first conversion module and the output opening of the second power conversion module.

The first power conversion module can provide voltage step-up and the second power conversion module can provide voltage step-down.

The apparatus can further include a connector configured to connect to an input power source and a first cable having a first end electrically connected to the connector and a second end electrically connected to the input of the first power conversion module; and the apparatus can be adapted for use as an in-line cable to connect a load to the input power source providing voltage transformation, galvanic isolation, or both there between.

The input power source can include an AC source and the connector can be adapted to mate with an AC outlet.

The connector can further include a rectifier electrically connected to receive power from the AC source and deliver rectified power at a unipolar voltage to the input of the first power conversion module via the first cable, and wherein the connector can be physically separated from the converter body by an electrical distance defined by the length of the first cable.

The connector can be a plug having two or more conductive prongs.

The apparatus can further include a first cable routed through the input opening and electrically connected to the input of the first power conversion module, and a second cable having a first end routed through the output opening and electrically connected to the output of the first power conversion module and a second end connected to the load, wherein the load can include a second power conversion circuit.

The second power conversion circuit can further include one or more outputs adapted to deliver power at one or more regulated output voltages.

The apparatus can further include a second cable having a first end connected to the output of the first power conversion module and a second end connected to the load, wherein the load can include a second power conversion circuit having a controller for controlling the power factor of the power drawn from the output of the first power conversion circuit.

The module body can further include a conductive member electrically connected to an input or output of the first power conversion module and being constructed and arranged to spread heat from the circuitry along a pre-defined region of the module body.

The input opening can be adapted to accommodate a cable, and the apparatus can further include a first cable routed through the input opening and electrically connected to the input of the first power conversion module, and wherein the conductive member can include a pair of conductive members connected between the first cable and the input and forming a heat spreading sheath around a selected portion of the circuitry.

The output opening can be adapted to accommodate a cable and the apparatus can further include a second cable routed through the output opening and electrically connected to the output, and wherein the conductive member can further include another conductive member connected between the second cable and the output and forming a heat spreading sheath around a selected portion of the circuitry.

The module body can further include an electrically insulating covering surrounding the conductive members and a portion of the first cable.

The module body can include an electrically insulating exterior molded around the conductive members, the first power conversion circuit and portions of the first and second cables.

The module body can further include one or more conductive members thermally connected to the circuitry and being constructed and arranged to spread heat from the circuitry along one or more pre-defined regions of the module body and an electrically insulating covering surrounding the conductive members and the circuitry.

In another general aspect, a power conversion apparatus includes an input connector having a connector body and conductive terminals adapted for connection to a power source; a first cable having a first end terminating in the connector body; a rectification circuit connected to at least one of the terminals and to the first cable to transmit power received from the power source and rectified to a unipolar voltage to the first cable; and a first power conversion module having an input connected to a second end of the cable, and including a module body adapted for use in-line with the first cable, the module body having an internal volume and being physically separate from the connector body. The first power conversion module has an output and circuitry contained in the internal volume, the circuitry being adapted to convert power received from the input at an input voltage, Vin, for delivery to the output at a unipolar output voltage, Vo, via a transformer at an essentially fixed voltage transformation ratio, K=Vo/Vin. The apparatus provides voltage transformation, galvanic isolation or both between the conductive terminals and the output.

Implementations of the apparatus can include one or more of the following features. The apparatus can further include a second cable having a first end connected to the output of the first power conversion module and a second end connected to an output connector.

The input connector can include a wall plug adapted to mate with an AC outlet.

The first power conversion module can further include a first voltage transformation ratio K1 for operation at a low input voltage and a second voltage transformation ration K2 for operation at a high input voltage.

The module body can further include a conductive member electrically connected to an input or output of the first power conversion module and being constructed and arranged to spread heat from the circuitry along a pre-defined region of the module body.

The conductive member can include a pair of conductive members connected between the first cable and the input of the first power conversion module and forming a heat spreading sheath around a selected portion of the circuitry.

The conductive member can include a pair of conductive members connected between the second cable and the output and forming a heat spreading sheath around a selected portion of the circuitry.

The conductive member can further include another pair of conductive members connected between the first cable and the input and forming a heat spreading sheath around a selected portion of the circuitry.

The module body can further include an electrically insulating covering surrounding the conductive members and a portion of the first and second cables.

The apparatus can further include an electronic device having a power connector adapted to mate with the output connector, a second power conversion circuit having an input connected to receive power from the power connector and one or more outputs for supplying power to circuitry associated with the electronic device, the second power conversion circuit being adapted to regulate power delivered via the one or more outputs.

The second power conversion circuit can further include a power factor controller adapted to control an envelope of current drawn by the second power conversion circuit from the power connector.

In another general aspect, a power conversion apparatus includes a first power conversion circuit having a first input for receiving power, a first output, and first circuitry adapted to convert power received from the first input at a first input voltage, Vin1, for delivery to the first output at a unipolar first output voltage, Vo1, via a transformer at an essentially fixed first voltage transformation ratio, K1=Vo1/Vin1; and a second power conversion circuit having a second input for receiving power, a second output, and second circuitry adapted to convert power received from the second input at a second input voltage, Vin2, for delivery to the second output at a unipolar second output voltage, Vo1, via a transformer at an essentially fixed second voltage transformation ratio, K2=Vo2/Vin2. The first input is connected to receive power from a power source; the first output is connected to supply power to a bus; the second input is connected to receive power from the bus; the second output is connected to supply power to a load; Vo1 is greater than Vin1; and Vo2 is less than Vin2.

Implementations of the apparatus can include one or more of the following features. The apparatus can further include a first power conversion module including a module body having an internal space in which the first power conversion circuit is housed, an input opening adapted to accommodate an electrical connection to the first input, and an output opening adapted to accommodate an electrical connection to the first output, in which the first power conversion module can be adapted to be used as part of a wire harness to provide voltage transformation, galvanic isolation, or both in-line between the first input through the input opening and the first output through the output opening.

The apparatus can further include a second power conversion module including a module body having an internal space in which the second power conversion circuit is housed, an input opening adapted to accommodate an electrical connection to the second input, and an output opening adapted to accommodate an electrical connection to the second output; wherein the second power conversion module can be adapted to be used as part of a wire harness to provide voltage transformation, galvanic isolation, or both in-line between the second input through the input opening and the second output through the output opening.

The output opening of the first power conversion module can be adapted to accommodate a cable; the input opening of the second power conversion module can be adapted to accommodate a cable; and the apparatus can further include a first cable having a first end and a second end; the first end being routed through the output opening of the first power conversion module and electrically connected to the first output; the second end being routed through the input opening of the second power conversion module and electrically connected to the second input.

In some examples, K1 can be greater than or equal to 4. In some examples, K2 can be less than or equal to ¼. In some examples, K2 can be less than or equal to ⅛.

In some examples, K1 can be greater than 1 and K2 can be less than 1.

In another general aspect, a method of supplying power is provided. The method includes providing a first inline power conversion module ("ICM") having an enclosure including an input opening for receiving a wire for connection to an input, an interior space, switching power conversion circuitry located in the interior space and being adapted to convert power received from the input at a first unipolar input voltage, Vin1, for delivery to an output at a first unipolar output voltage, Vo1, via a transformer at an essentially fixed voltage transformation ratio, K1=Vo1/Vin1, wherein K1 is less than or equal to unity; providing a first wire to conduct power through a length of the wire from a source connected to a first end of the wire through the input opening to the input connected to a second end of the wire; connecting the output of the first ICM to a first load; and positioning the first ICM in proximity to the first load such that a distance between the first load and the first ICM is less than 1/N times the length of the first wire.

Implementations of the method can include one or more of the following features. In some examples, N is greater than or equal to 2. In some examples, N is greater than or equal to 5. In some examples, N is greater than or equal to 10.

The source can include a rectification circuit having an output connected to the first wire and an input adapted for connection to an AC source.

The method can further include mating a connector with an AC outlet, and providing the rectification circuit in an interior space of a body of the connector.

The first ICM can further include a first voltage transformation ratio K1 for operation at a low input voltage and a second voltage transformation ration K2 for operation at a high input voltage.

The first voltage transformation ratio K1 can be equal to about ⅘ and the second voltage transformation ratio K2 can be equal to about ⅖.

The enclosure can further include an output termination connected to the output of the first ICM and configured for connection to load by a screw.

The source can include a power regulator.

The ICM can further include a communication port for sending or receiving communication signals; and the method can further include providing a signal wire to conduct communication signals through a length of the wire from the source connected to a first end of the signal wire through the input opening to a communication input connected to a second end of the signal wire.

In another general aspect, an apparatus includes a first power conversion module including a module body adapted to accommodate an electrical connection to an input of the first power conversion module and an electrical connection to an output of the first power conversion module, and an internal space; the first power conversion module including circuitry contained in the internal space and adapted to convert power received from the input at an input voltage, Vin, for delivery at the output at a unipolar output voltage, Vo, via a transformer at an essentially fixed voltage transformation ratio, K=Vo/Vin. The first power conversion module is adapted to be used as part of a wire harness to provide voltage transformation, galvanic isolation, or both in-line between the input and the output. The module body includes at least two terminals adapted to form high current connections.

Implementations of the apparatus can include one or more of the following features. The at least two terminals can each further include a conductive region of a surface of the module body and a hole formed in the conductive region and being adapted to accommodate a fastener for making an electrical and mechanical connection to the module body. K can be less than or equal to ¼.

The inline power conversion module can have one or more of the following advantages. The inline power conversion module may provide power density that is much higher than conventional solutions and enable manufacture of power adapters that are smaller, lighter, more efficient and easier to store and transport than prior-art devices. In some examples, the inline power conversion module can have cross-sectional dimensions comparable to, or slightly larger than, those of the cables connecting the inline power conversion module to the input source and the load. The small sizes and weights allow the inline power conversion modules to be used as part of wire harnesses (or be connected to ends of wire harnesses) and conveniently deployed in, e.g., aviation, portable electronics, computing, and vehicle applications. In some examples, by using a step-up inline power conversion module near the power source and a step-down inline power conversion module near the load, power can be transferred through a bus that has a higher voltage and a smaller current, allowing a smaller gauge wire to be used than would otherwise be required to carry the same power at the lower voltage. Minimizing the length of low voltage cable may beneficially save weight, size, and cost in the system over traditional power harnesses.

DESCRIPTION OF DRAWINGS

Like reference symbols in the various drawings indicate like elements.

DETAILED DESCRIPTION

Many electrical systems require power distribution from a centralized source to one or more loads separated from the source by a distance. As electronic loads proliferate and voltage requirements decrease concomitantly increasing current demands, sometimes force difficult tradeoffs between transmission efficiency, e.g. due to I2R power losses, material costs, e.g. as copper cost, weight limitations, e.g. in vehicular, particularly aviation, applications, and size constraints, such as in portable electronics, computing, and vehicle applications.

I. In-Line Converter Module

Figure 1:
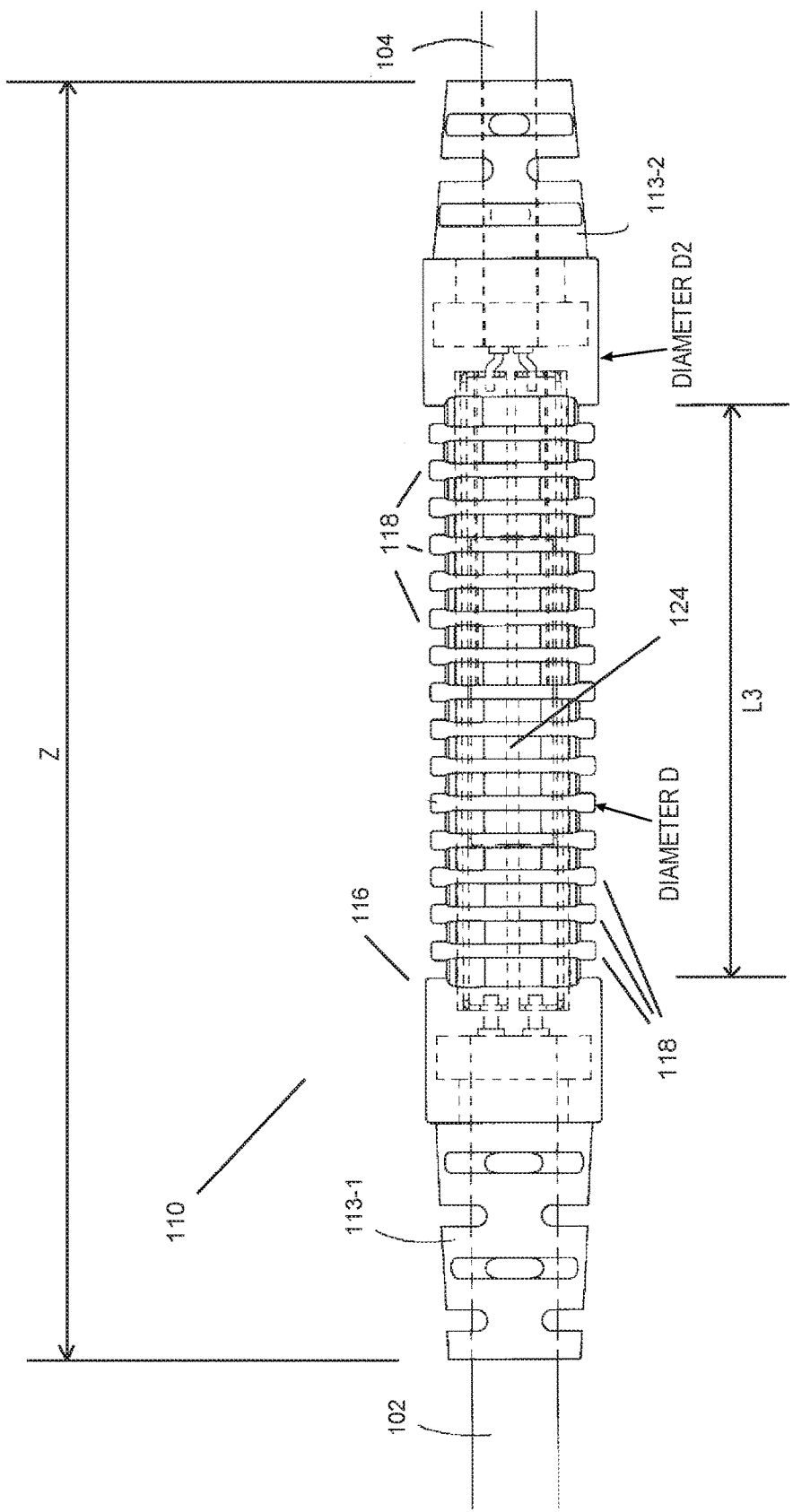
FIG. 1 shows an inline converter module.
Figure 2:
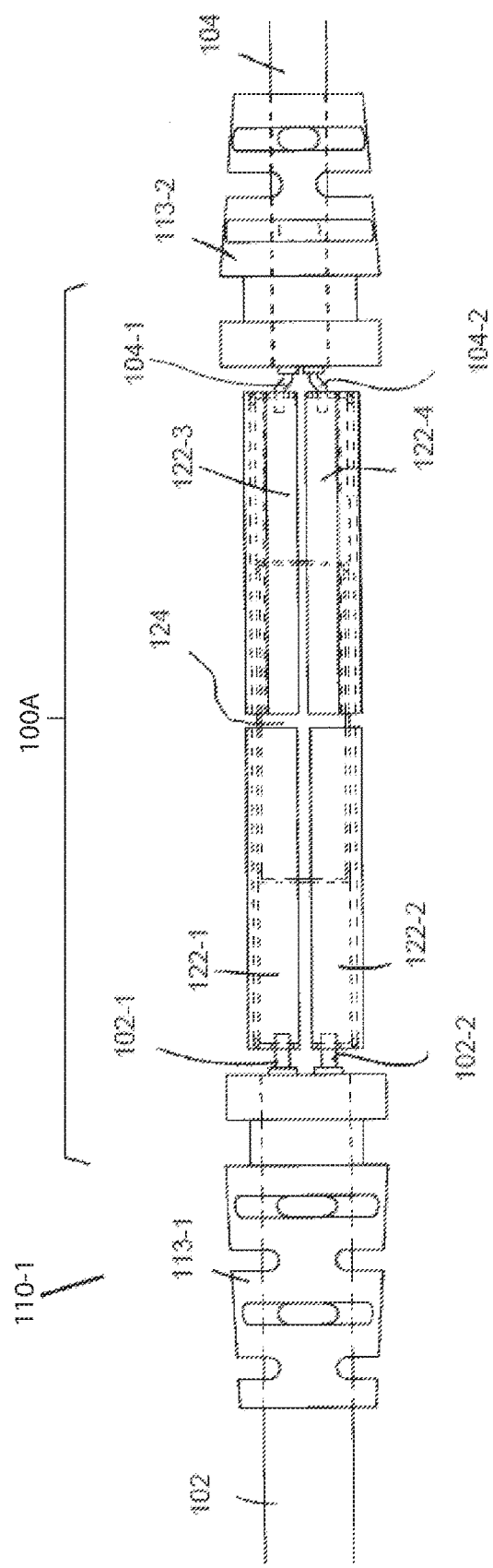
FIG. 2 shows the in-line converter module of FIG. 1 with the outer package removed.
Figure 3:
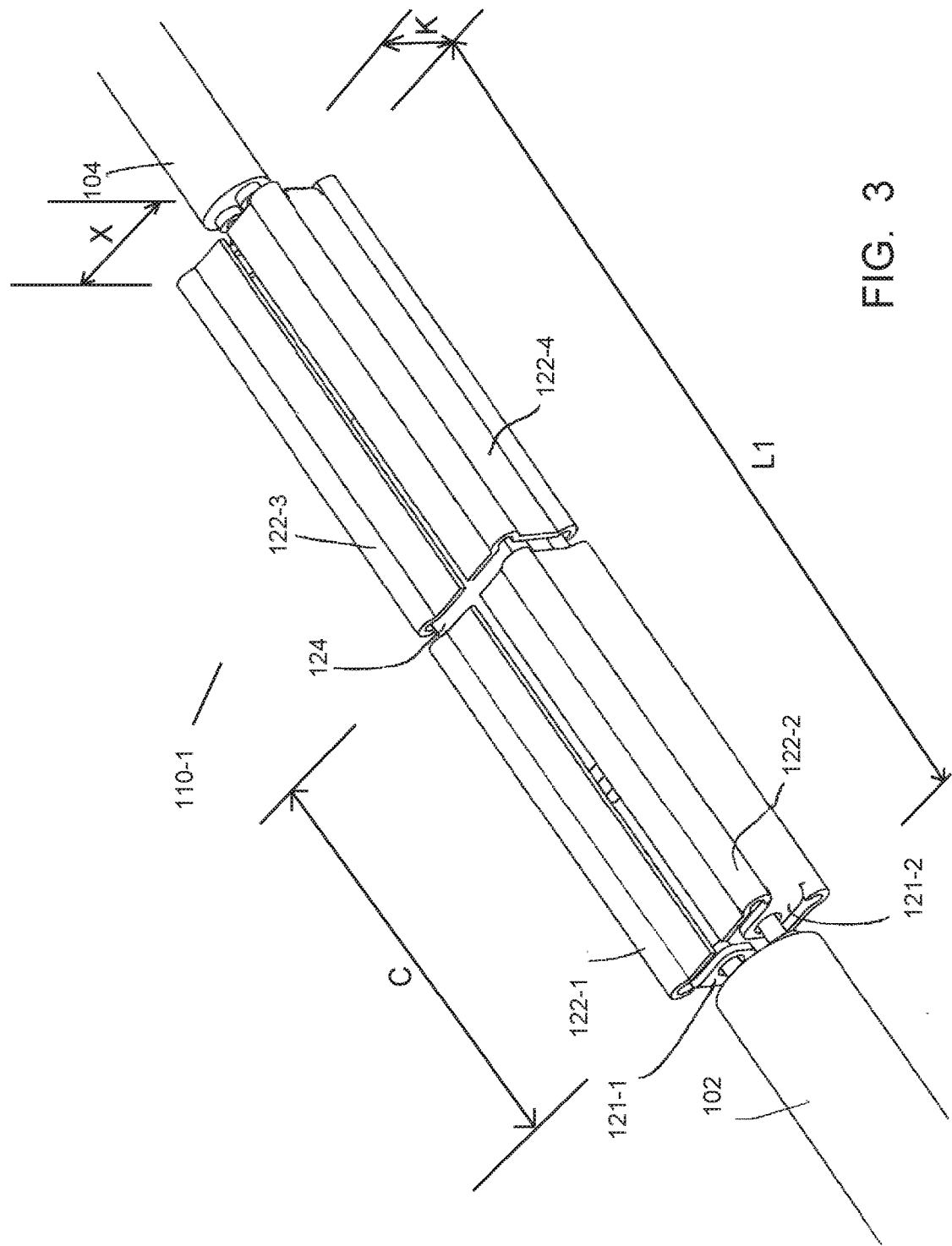
FIG. 3 shows the perspective view of a portion of the assembly of FIG. 2.
Figure 4:
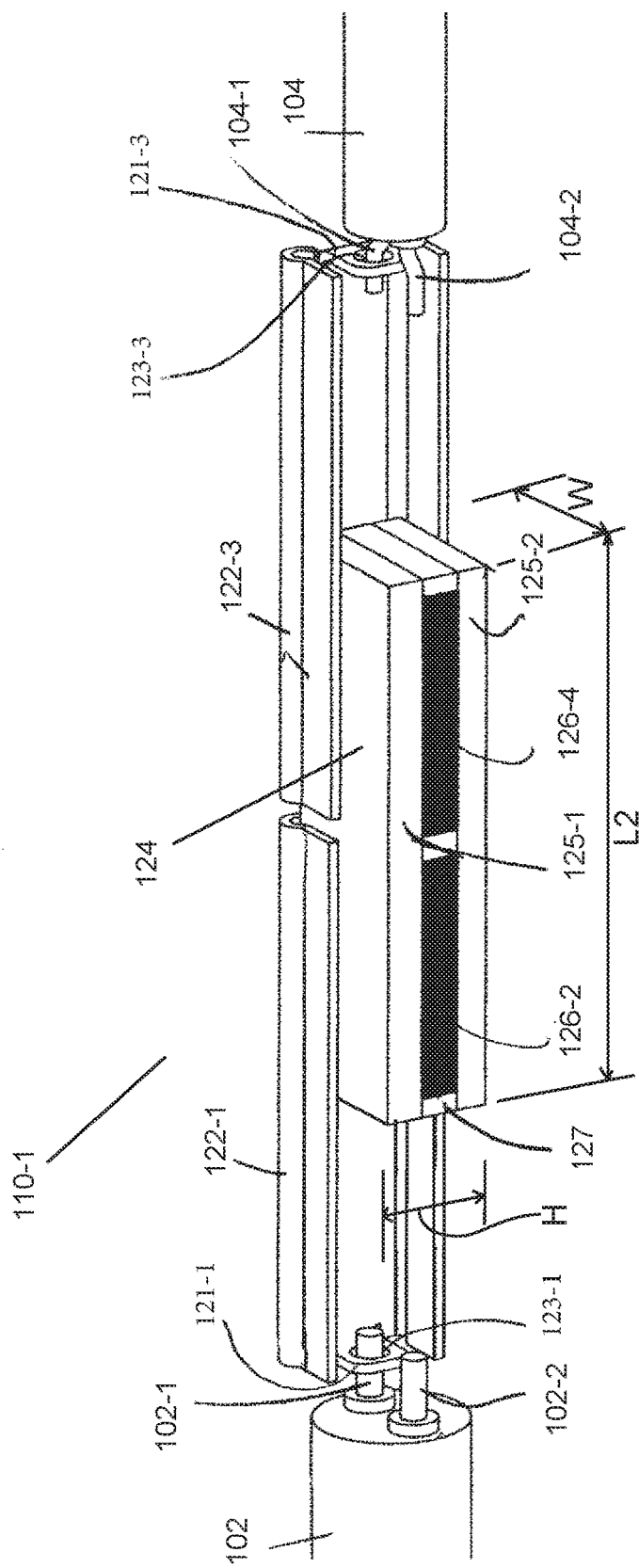
FIG. 4 shows a perspective view of a portion of the assembly of FIG. 3.

Referring to FIG. 1 an in-line converter module ("ICM") 110 is shown comprising a power converter 124, preferably a switching power converter. As shown in the top view of FIG. 1, the ICM 110 may be configured for mid-cable deployment, i.e. with a wire harness at each end of the ICM body 116. For example, in FIG. 1 wire harness 102 enters an opening at one end, and a second wiring harness 104 enters an opening at another end of the ICM body 116 which includes strain-relief features, 113-1, 113-2. FIGS. 2, 3, and 4 show the ICM 110 in various stages of disassembly: a portion of the body 116 is removed in the top view of FIG. 2 revealing conductive contacts 122-1-122-4, the strain relief features 113-1, 113-2 are removed in the perspective view of FIG. 3, and finally conductive contacts 122-2 and 122-4 are removed in the perspective view of FIG. 4 revealing a power converter 124 and peripheral contact regions 126-2 and 126-4.

As shown in FIG. 4, the circuitry of the power converter 124 may be encapsulated to form a unitary device, for example using the processes described in Vinciarelli et al., Panel Molded Electronic Assemblies, PCT Application Ser. No. US 2012/034795 filed May 11, 2012, (the "Panel Mold application") assigned to VLT, Inc. and incorporated here by reference in its entirety. The Panel Mold application describes Panel Mold processes for molding circuits formed on a multilayer printed circuit board ("PCB") to produce individual circuits having a multilayer printed circuit board ("PCB") substrate and an outer package formed at least in part by encapsulation. The Panel Mold process exposes conductive contacts along the periphery of the multilayer PCB during singulation as described in Vinciarelli, et al., Method of Forming an Electrical Contacts, U.S. Pat. No. 8,966,747, issued Mar. 3, 2015 (the "Bar Code patent") assigned to VLT, Inc. and incorporated here by reference in its entirety.

Figure 5:
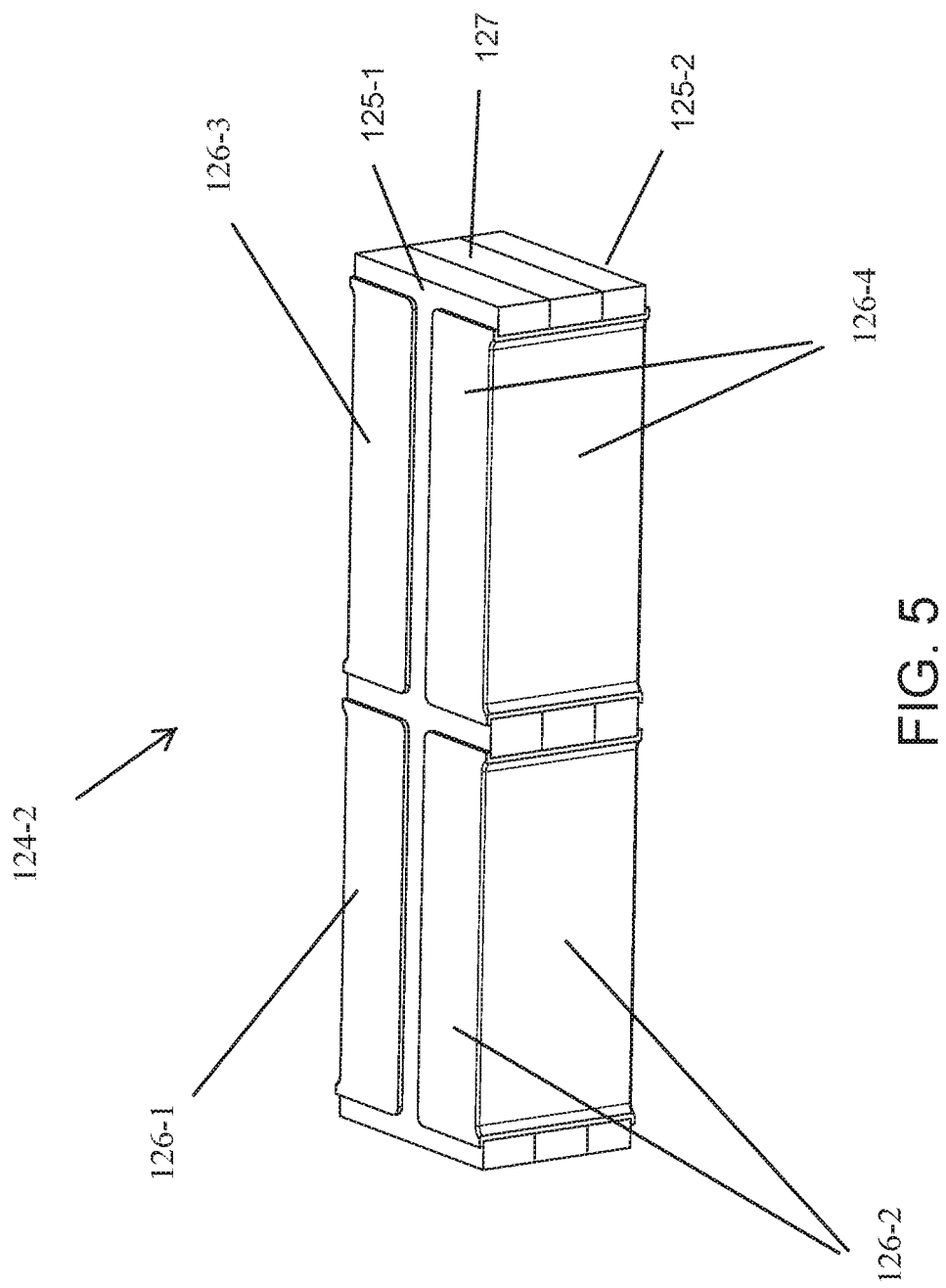
FIG. 5 shows an encapsulated power converter with plated peripheral contact regions.

The encapsulated package shown for the power converter circuitry 124 in FIGS. 1-4 may be made using the processes described in the Panel Mold application and have exposed contacts to make electrical connections to the circuitry as described in the Bar Code patent. As shown in FIGS. 2, 3, 4, power conversion circuit 124 includes a PCB 127 with encapsulated top and bottom surfaces 125-1, 125-2 and peripheral conductive contact regions 126-1 through 126-4 (regions 126-2 and 126-4 are visible in FIG. 4) along one or more sides of the PCB 127. The conductive regions 126-1-126-4 (FIG. 4) may include features formed in the conductive layers of the PCB 127 and exposed at the edges of the power converter assembly 124 as described in the Bar Code patent. Alternatively, referring to FIG. 5 which shows another power converter 124-2 having the conductive contact regions 126-1, 126-2, 126-3, 126-4 optionally extending along one or more surfaces of the encapsulated device, e.g. made using the processes described in Vinciarelli et al., Panel Molded Electronic Assemblies with Multi-Surface Conductive Contacts, U.S. patent application Ser. No. 14/731,287, filed Jun. 4, 2015 (the "Leadless PM application") assigned to VLT, Inc. and incorporated here by reference in its entirety. As shown in FIG. 5, each conductive contact region may include a side, top, and bottom portion disposed on the respective side, top, and bottom surfaces of the encapsulated power converter.

Figure 6:
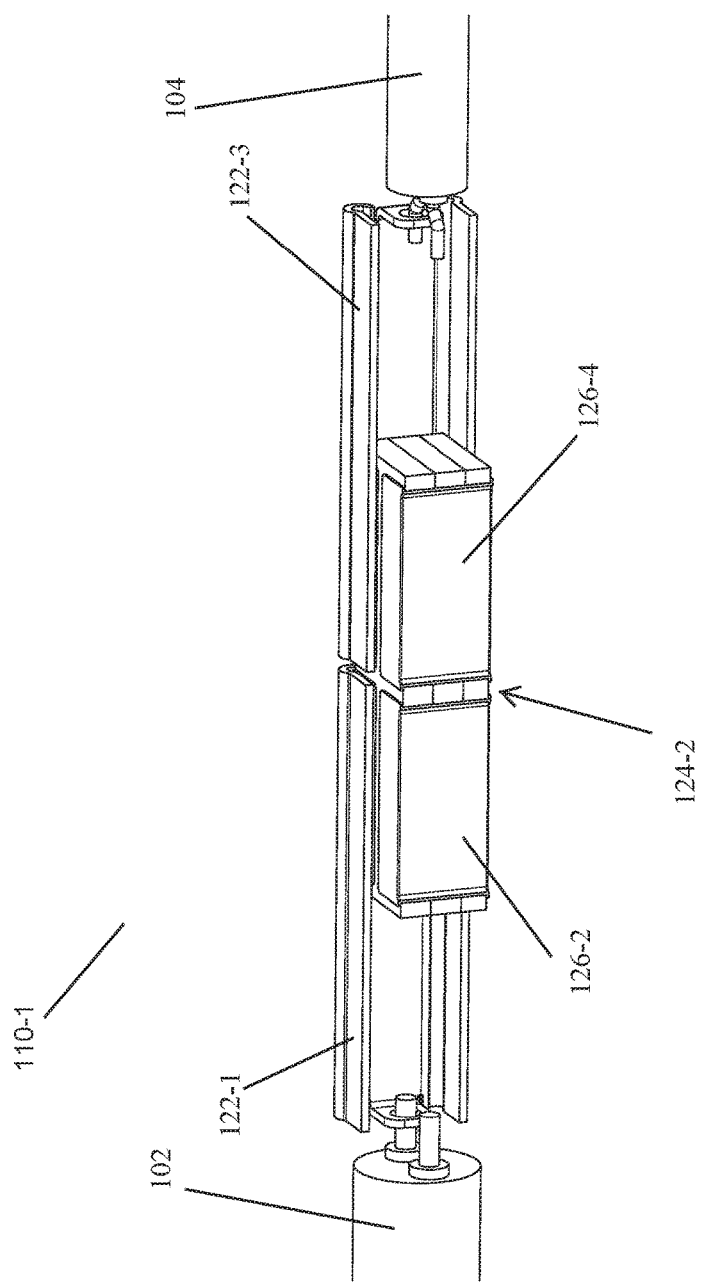
FIG. 6 shows a portion of the assembly of FIG. 2 using the power converter of FIG. 5.

The ICM 110 may include conductive contacts 122-1, 122-2, 122-3, 122-4 as shown (FIGS. 2-4, 6) configured to make electrical, and preferably mechanical and thermal connections, to the power converter 124, 124-1, e.g. through respective peripheral conductive contact regions, 126-1, 126-2, 126-3, 126-4 (FIGS. 4, 5) by soldering, welding, conductive adhesives, compression fit, etc. The conductive contacts, 122-1, 122-2, 122-3, 122-4, may be adapted as necessary to connect to a respective conductor of a wire harness as shown FIGS. 2-4, 6. For example, one or more of the conductive contacts 122-1, 122-2, 122-3, 122-4 may include a respective tab 121-1, 121-2, 121-3, 121-4 and optionally a respective hole 123-1, 123-2, 123-4 (FIG. 4) for receiving a respective wire. As shown in the FIGS. 1-4 and 6, conductive wires 102-1, 102-2 of harness 102, may be inserted into holes 123-1, 123-2 in tabs 121-1, 121-2 of conductive contacts 122-1, 122-2 to form electrical connections with the respective peripheral contact regions 126-1, 126-2 of the power converter 124 (FIGS. 1-4), 124-2 (FIG. 6). Similarly, conductive wires 104-1, 104-2 of harness 104, may be inserted into holes 123-3, 123-4 in tabs 121-3, 121-4 of conductive contacts 122-3, 122-4 to form electrical connections with the respective peripheral contact regions 126-3, 126-4 of the power converter 124 (FIGS. 1-4), 124-2 (FIG. 6). The wires may be connected to the contacts by soldering, welding, conductive adhesives, or crimping, etc.

Figure 7:
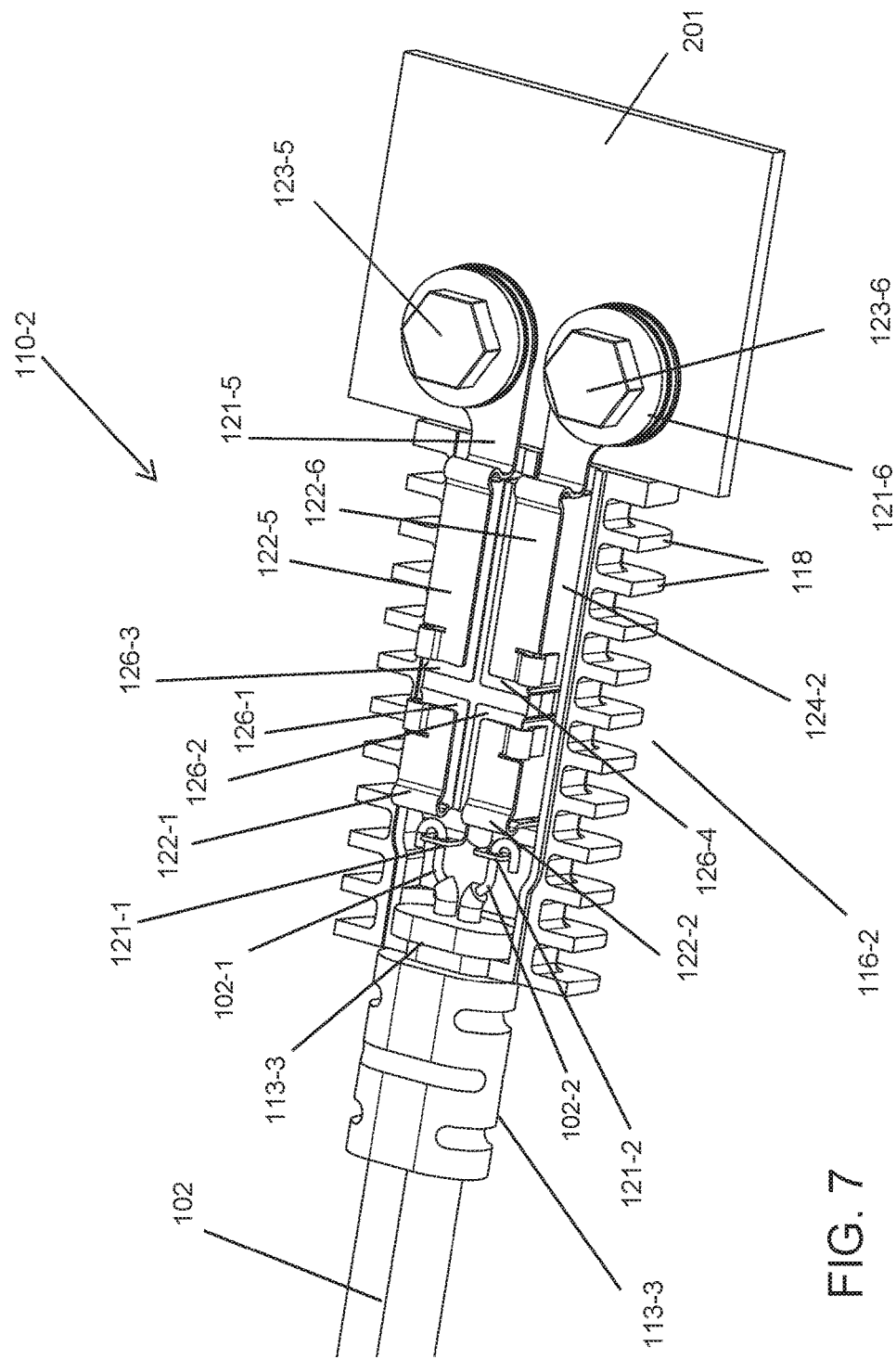
FIG. 7 shows another in-line converter module with a portion of the outer package removed.

Referring to FIG. 7, an ICM 110-2 is shown configured for cable-termination deployment. For example, in FIG. 7 wire harness 102 enters an opening at one end, and electrical terminals exit an opening at another end of the ICM body 116, which includes strain-relief features 113-3. FIG. 7 shows the ICM 110-2 with a portion of the body 116-2 removed to reveal the wires 102-1, 102-2, conductive contacts 122-1, 122-2, 122-5, 122-6, power converter 124-2, and peripheral contact regions 126-1, 126-2, 126-3 and 126-4. The left side of the body including harness 102, strain relief 113-3, wires 102-1, 102-2, mating contacts 122-1 and 122-2, and peripheral contacts 126-1, 126-2 are similar to those shown and described above in connection with FIGS. 1-4, 6. The right side of ICM 110-2, however, replaces the harness interface features (strain relief, contacts, tabs, and holes) with screw termination features. Contacts 122-3 and 122-4 have been replaced with contacts 122-5, 122-6 having tabs 121-5, 121-6 protruding from the ICM body 116-2. Tabs 121-5, 121-6 are further adapted to mate with hardware, such as the screws 123-5, 123-6 for making electrical and mechanical connection with an external device such as a PCB 201 shown in FIG. 7. Although screws and a PCB are shown in FIG. 7, it should be appreciated that contacts 122-5, 122-6 may be configured for mating with any suitable electro-mechanical termination desired, e.g. including connectors, pins, etc.

Figure 13:
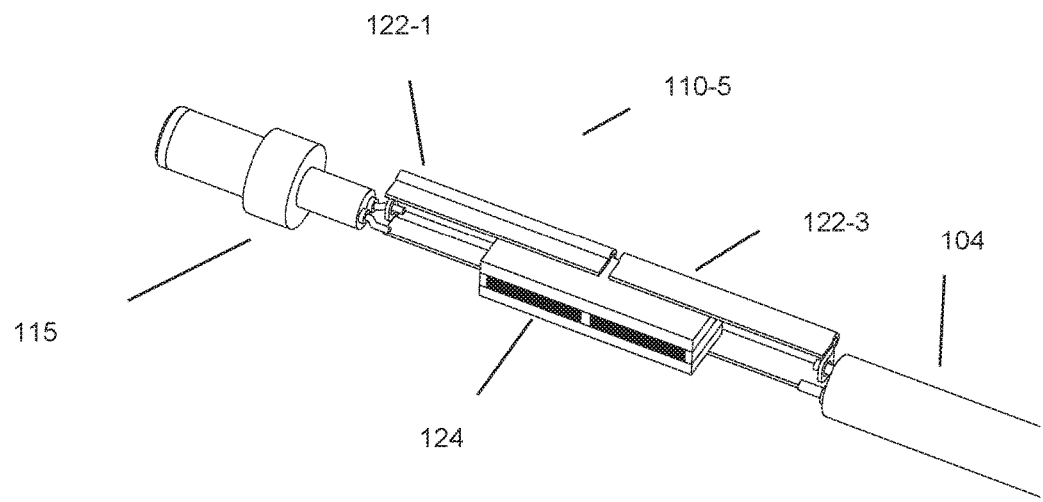
FIG. 13 shows a portion of an in-line converter module assembly including a connector.
Figure 14:
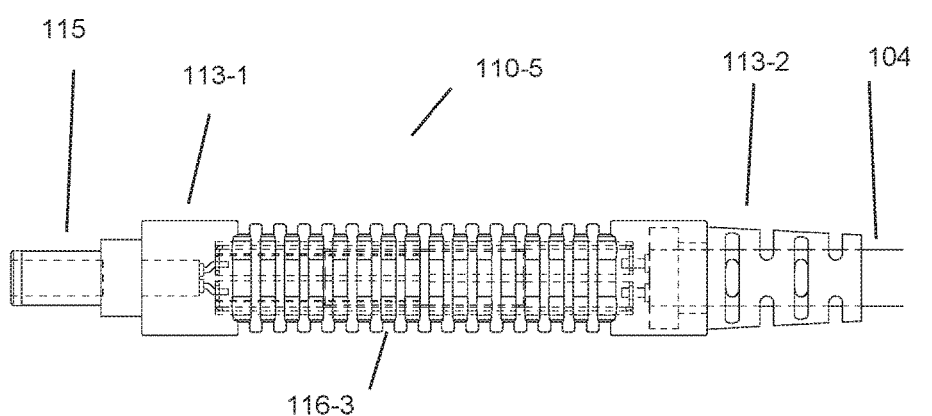
FIG. 14 shows an in-line converter module assembly including a connector.

Referring to FIG. 14, another ICM, 110-5, is shown having a connector 115 at one end and a wire harness 104 at the other end. FIG. 13 shows ICM 110-5 partially disassembled in a view similar to those of FIGS. 4 and 6. As can be seen by comparing FIG. 13 with FIGS. 4 and 6, the connector 115 (FIG. 13) replaces the wire harness 102 (FIGS. 4, 6). The connector 115 may be electrically connected to respective contacts 122-1, 122-2 by wires as shown. Alternatively, the contacts may be formed into the desired shape for inclusion in the connector. The assembly may be encapsulated with an insulative material as discussed above, providing mechanical integrity for the ICM and strain relief for the wire harness 102 and connector 115. Although shown in FIGS. 13 and 14 with the connector on the input-side of the ICM, the ICM may be configured with a connector on either, or both ends.

The conductive contacts 122-1, 122-2, 122-3, 122-4 (FIGS. 1-4, 6, 13) and 122-5, 122-6 (FIG. 7) and the shape of the ICM body 116 (FIGS. 1-4), 116-2 (FIG. 7), 116-3 (FIG. 14) may be configured to aid in removal of heat from the power converter. For example, the conductive contacts 122-1 through 122-6 may be made of a highly thermally-conductive material, such as copper or brass and may be thermally connected to the power converter, e.g. through contact regions 126-1, 126-2, 126-3, 126-4 and through surfaces of the power converter 124, 124-2. As shown in FIGS. 1-4, 7, 13 the contacts 122-1 through 122-4 form a heat spreading envelope (or sheath) around and contacting as much surface area of the power converter 124 as possible, subject to spacing requirements for the conductors. The contacts 122 may be elongated to increase the surface area and further decrease the overall thermal resistance between the circuit and the external ambient air as shown in FIGS. 2-4: contact length C (FIG. 3) establishes the length L1 (FIG. 3) of the heat spreading envelope (or sheath) which is longer than the power converter, length L2 (FIG. 4), providing greater surface area for conducting heat away from the power converter 124.

The outer body 116, 116-2, 116-3 preferably encloses the power converter 124, conductive contacts 122, strain reliefs 113, and wire connections as shown in FIG. 1 preserving the mechanical integrity of the assembly and electrically insulating the internal connections. The outer body 116 may be formed by over molding the assembly 100A of FIG. 2 with a suitable material, such as a thermally-conductive and electrically-insulating encapsulation material. Over molding may fill voids within the package, thereby reducing the thermal resistance of the path between the exterior surface of the outer package 116 and the power converter 124 and contacts 122. The body 116 also may be configured to aid in removal of heat, e.g., by increasing the outer surface area using fins 118 (FIGS. 1, 7) or other features to further reduce thermal resistance between the outer package and the external ambient air. The strain relief features 113 may be an integral part of the respective wiring harnesses, individual components added to the harness before encapsulation, or formed during the encapsulation process. Additional heat may be conducted away from the power converter 124, 124-2 through the wires 102, 104 and through the contacts and mounting hardware 121-5, 121-6.

Figure 15:
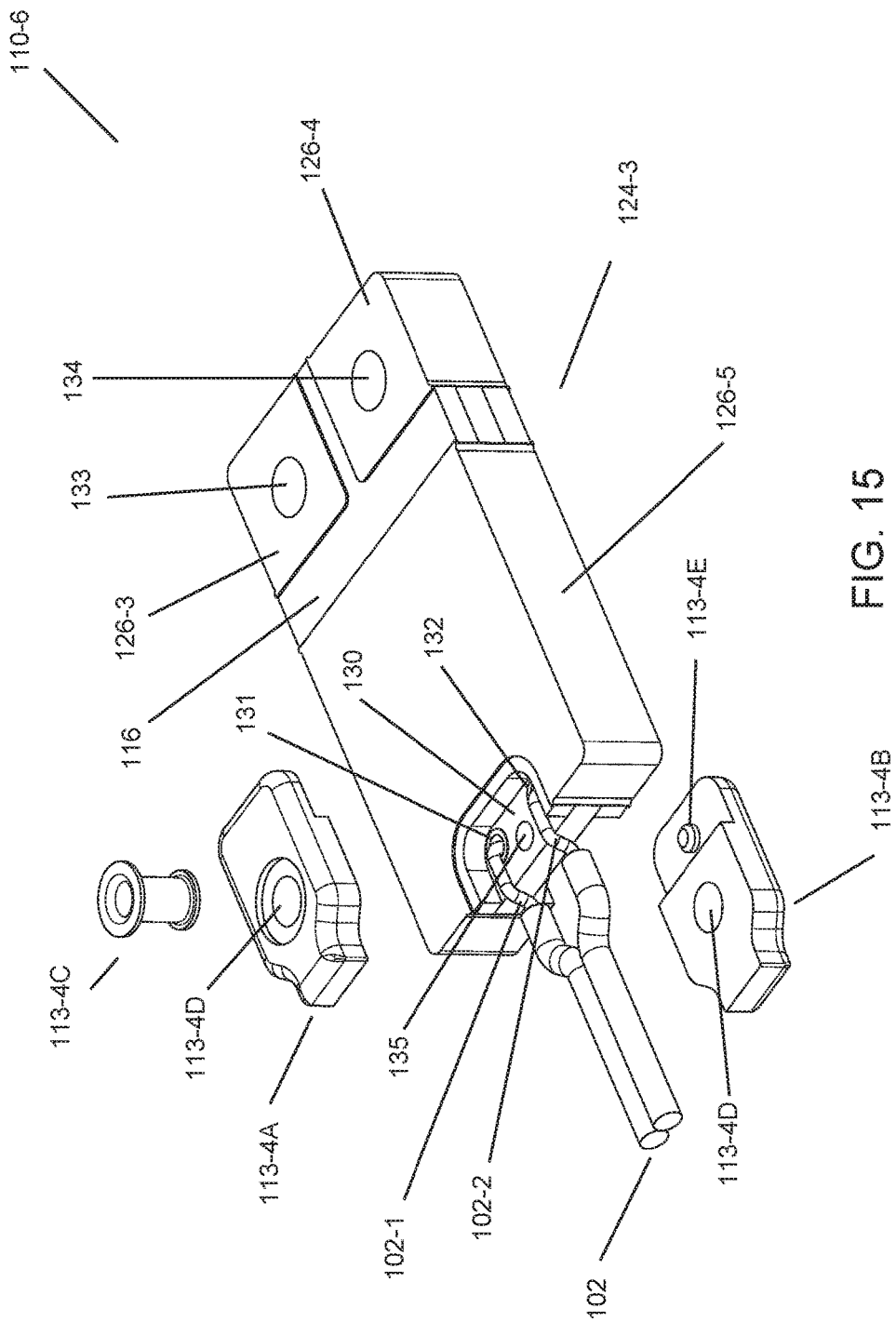
FIG. 15 shows an in-line converter module assembly configured for cable-termination deployment.

Referring to FIG. 15, another ICM 110-6 is shown configured for cable-termination deployment. However, unlike ICM 110-2 (FIG. 7), ICM 110-6 does not rely upon conductive contacts (e.g. 122 FIG. 7) to form the connections. As shown in FIG. 15, the converter 124-3 may include holes, 131, 132, 133, 134, preferably conductively plated, adapted to establish electrical connections for the input and output of the converter. For example, holes 131 and 132 may be plated through holes adapted to receive the input wires 102-1, 102-2 which may be soldered to the conductive plating. Similarly, holes 133, 134 may be adapted to receive mechanical fasteners such as screws (similar to 123-5, 123-6 shown in FIG. 7) for securing the converter 124-3 to a circuit board (similar to PCB 201 in FIG. 7) to form high current connections. A strain-relief assembly 113-4 may be provided for the input wire harness 102. As shown, strain-relief assembly 113-4 may include a top cover 113-4D, a bottom cover 113-4B, and rivet 113-4C or other fastener to secure the top and bottom covers together. A hole 135 may be provided in the converter to engage with features in the strain-relief assembly, such as projections 113-4E, to secure the input harness 102 to the converter 124-3. The strain-relief assembly may provide electrical insulation for the electrical input connections. A conductive plating may be formed around the converter body 116 to provide shielding and to aid in heat removal from the converter. The ICM 110-6 may be used without an insulative covering as shown in FIGS. 1, 7, and 14. The right side of ICM 110-6, replaces contacts 122-5, 122-6 and the tabs 121-5, 121-6 with plated through holes formed in the converter body for making electrical and mechanical connection with an external device (such as the PCB 201 shown in FIG. 7). Although holes adapted to receive screws are shown in FIG. 15, it should be appreciated that conductive pins may be provided, e.g. inserted in holes 133, 134, to engage with an external PCB or connector.

In this document, a wire harness, which may also be called a cable harness, cable assembly, wiring assembly or wiring loom, is in general terms an assembly of one or more cables or wires which transmit signals or electrical power. The cables are typically bound together by straps, cable ties, cable lacing, sleeves, electrical tape, conduit, a weave of extruded string, or a combination thereof to form the assembly. A wire harness may itself comprise a plurality of individual wire harnesses and optionally include one or more electrical components, which may be electrically connected to one or more of the wires in the harness and mechanically integrated with or into the harness. For example, in-line fuse assemblies may be integrated into a wire harness, such as in some automotive accessories. As used herein, the term "in-line" refers to an electrical component, such as a fuse, or an ICM assembly of the type shown in FIGS. 1, 7, 14, and 15, which is incorporated in a wire harness, e.g. at one or more ends, or somewhere between two ends of the wire harness. The in-line component may be removable from the harness at one or both ends, e.g. using one or more connectors, e.g. 115 in FIG. 14, for ease of assembly, reconfiguration, or service; or may be "hard-wired," e.g. using the wire-to-ICM connection mechanisms illustrated in FIGS. 1, 7, 14, and 15."

The ICM 110 may be configured for use in a broad range of power applications including (a) power adapters for converting power from the mains ("AC adapter") for electronic devices (TVs, laptop computers, etc.), (b) vehicular applications including automotive and aircraft, and (c) system power architectures, e.g. for distributing power in more complex systems (telecommunications, computing, and server environments), etc. particularly where high-efficiency fixed-ratio in-line power conversion is advantageous, as will be demonstrated by the several examples provided below. Exemplary power distribution architectures are described in Vinciarelli, Factorized Power Architecture with Point of Load Sine Amplitude Converters, U.S. Pat. No. 6,984,965, issued Jan. 10, 2006 (the "FPA Patent") and in Vinciarelli et al., Power Distribution Architecture with Series-Connected Bus Converter, U.S. application Ser. No. 13/933,252 filed Jul. 2, 2013 (the "NIBA" application), both of which are assigned to VLT. Inc. and are incorporated in their entirety herein by reference.

II. DC Transformer Based ICM

The ICM 110 may be configured for use as any of a variety of power conversion functional blocks, such as isolated and non-isolated, buck, boost, or buck-boost regulators, fixed-ratio DC transformers, etc. depending on the selection of the power converter 124; however, as described in greater detail below, the ICM 110 may be particularly versatile for a wide variety of applications when configured as a DC Transformer. As defined herein, a DC Transformer delivers a DC output voltage, Vout, which is a fixed fraction of the input voltage, Vin, delivered to its input and may optionally provide isolation between its input and its output. The voltage transformation ratio or voltage gain of the DC-transformer is defined herein as the ratio, K=Vout/Vin, of its output voltage to its input voltage at a load current. The voltage-transformation ratio of a DC-Transformer may be fixed by design, e.g. by the converter topology, the timing architecture, and the turns ratio of the transformer. Preferably, the DC Transformer may be implemented using the Sine-Amplitude Converter ("SAC") topologies and timing architectures described in Vinciarelli, Factorized Power Architecture and Point of Load Sine Amplitude Converters, U.S. Pat. No. 6,930,893 and in Vinciarelli, Point of Load Sine Amplitude Converters and Methods, U.S. Pat. No. 7,145,786 both assigned to VLT., Inc. and incorporated here in their entirety by reference (hereinafter the "SAC Patents"); and in the MBA application. A SAC used for power converter 124 in ICM 110 may be capable of achieving very high power densities and conversion efficiencies, providing voltage transformation and optionally galvanic isolation.

Figure 8:
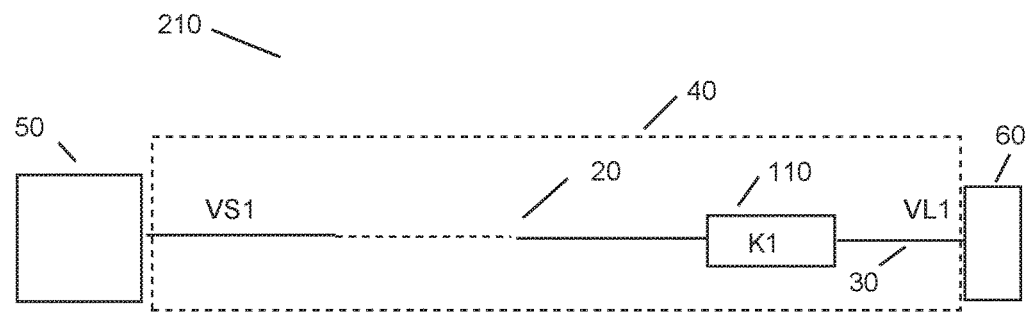
FIG. 8 shows a generalized power adapter using an inline converter module.

FIG. 8 shows a generalized schematic drawing of a power system 210, including a unipolar power source 50 connected to a load 60 by a power distribution harness 40, which includes a generic DC Transformer having a voltage transformation ratio, K1, in an ICM 110, and wire harnesses 20, 30 respectively connecting the input and output of the ICM 110 to the source 50 and load 60. The ICM converts power received from the unipolar source 50 at a source voltage, VS, for delivery to the load 60 at a load voltage, VL. In the generalized example of FIG. 8, the source voltage, VS, may be greater than the load voltage, VL, in which case, the ICM performs voltage step down and K1<1; or conversely the source voltage, VS, may be less than the load voltage, VL, in which case, the ICM performs voltage step-up and K1>1. In FIG. 8 the ICM 110 is shown separated from the source 50 by a distance that is relatively longer than the distance from the load 60 indicating that the ICM may be located at or near the load end of the power distribution harness 40. However, the ICM 110 may alternatively be located at or near the input end or in the middle of the harness. Although a generic DC transformer is shown in FIG. 8, it should be understood that a variety of voltage transformation modules (VTMs), ACMs, and other converters may provide the voltage transformation function, either with or without galvanic isolation, and either with or without auto-ranging, used in the power conversion system 210 depending upon the specific application.

Referring to FIGS. 1-4, and 6, the wire harness 104 and its associated wires 104-1, 104-2 are shown smaller than harness 102 and its associated wires 102-1, 102-2 in FIGS. 1-4, 6 illustrating that one of the cables may be carrying only a fraction (K) of the current of the other cable or that the insulation of one cable may need to withstand only a fraction (K) of the voltage stress of the other. The larger gauge harness 12 may therefore be used for the input to a step-up (K>1, VL>VS) converter module or the output of a step-down (K<1, VL<VS) converter module. Using the step-down (K<1, VL<VS) configuration as an example, input power may be delivered to the power converter 124 from wiring harness 104 via contacts 122-3 and 122-4 and output power may be delivered to a load 60 (FIG. 8) via contacts 122-1 and 122-2 and wiring harness 102. The relative lengths and diameters of the wiring harnesses and the sizes of wires in them may be configured based upon the currents and voltages carried by the respective harnesses.

A. AC Adapter

Figure 9:
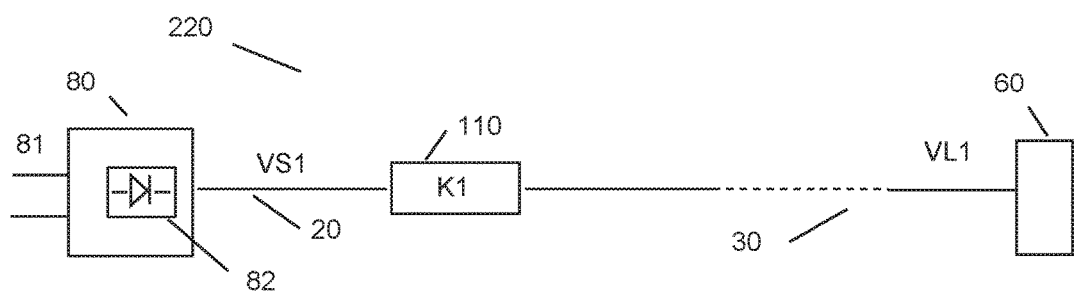
FIG. 9 shows an AC adapter using an in-line converter module.

An AC adapter application of a DC Transformer based ICM 110 will be described in connection with FIG. 9. Referring to FIG. 9, the AC adapter 220 may include a connector 80 adapted for connection to an AC source (not shown), e.g. a plug 81 for connection to an AC wall outlet, a wire harness 20 connecting the input of the ICM 110 to the AC connector, and wire harness 30 connecting the output of the ICM to the load 60. Although not shown in FIG. 9, the wire harness 30 may include a connector suitable for engagement with the load 60, e.g. as commonly used for portable computers and other electronic devices.

As shown in FIG. 9, connector 80 may include a rectifier circuit 82 and optionally noise filtering and surge and fuse protection circuitry, preferably in the body of the connector, providing power from the AC source at a unipolar voltage to the input of the DC Transformer. Locating the rectifier circuitry in the connector, away from the ICM 110 as shown, moves the heat associated with power dissipation in the rectifier outside of the ICM, allowing for a smaller package for each. The ICM 110 may be configured to provide voltage transformation as described above (along with galvanic isolation for safety) outputting power at a relatively low (safe) unipolar voltage, e.g. 48V, 24V, etc., to load 60 via wire harness 30. The load 60 may include a regulation stage and optionally perform power factor correction on the current drawn from the output of the in-line conversion module 110.

Various efficient high-power-density AC adapters using DC-transformers to convert power received from a rectified AC utility line voltage and deliver power at a lower unipolar-voltage, providing galvanic isolation, to downstream electronic voltage regulators are described in Vinciarelli, Universal AC Adapter, U.S. Pat. No. 7,548,441, issued Jun. 16, 2009, and in Vinciarelli, Universal AC Adapter, U.S. Pat. No. 7,940,540, issued May 10, 2011 (the "AC Adapter patents"), both assigned to VLT, Inc. and incorporated by reference.

Preferably, the AC adapter 220 in FIG. 9 may employ a SAC-based auto-ranging converter module ("ACM") for use in the ICM 110. Such an ACM may include a pair of SAC input cells adaptively configured in series or parallel to provide auto-ranging operation on world-wide AC (120V and 240V nominal) utility lines while producing substantially the same unipolar output voltage, as well as to reduce the relative variation of the unipolar output voltage as the input voltage varies within a range of voltages. The input cells may be coupled via a common transformer to one or more output cells, optionally connected in parallel. Such an ACM based ICM may be adapted to operate over an input voltage range from 120V to 240V and deliver up to 100 Watts to the load. Auto-ranging converter modules using adaptively configured SAC cells are described in Vinciarelli, Adaptively Configured and Auto-Ranging Voltage Transformation Module Arrays, U.S. Pat. No. 7,212,419 issued May 1, 2007 assigned to VLT., Inc. and incorporated here in its entirety by reference (hereinafter the "ACM patent").

The ACM based ICM 110 may use a voltage transformation ratio $K1a=Vo/Vin=¼$ for the low input voltage range and $K1b=Vo/Vin=⅛$ for the high input voltage range, nominally producing a 42V peak unipolar output. As configured, the input to the ACM based ICM 110 may receive a rectified and optionally filtered sine wave at the line voltage which means the output of the ICM 110 will be an essentially rectified sine voltage waveform. Depending on the load, an additional regulation stage may be required, e.g. at the load, for powering electronic circuitry, etc. As described in the AC Adapter patents, one or more regulation stages may be located in the device being powered by the AC adapter. For example, the AC adapter may be used to supply power to a computer or portable electronic device, such as a cell phone, tablet, or laptop, etc.

Figure 10:
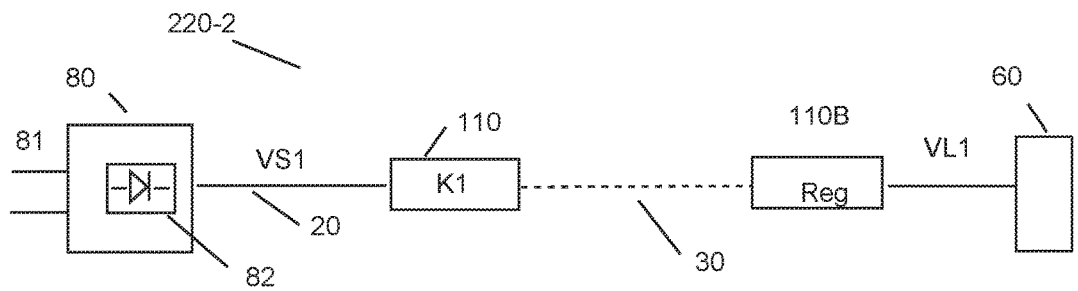
FIG. 10 shows an AC adapter using two in-line converter modules.

Alternatively, the regulation stage may be incorporated into a second regulator based ICM 110B as shown in system 220-2 in FIG. 10. As shown, the regulator based ICM 110B (which may be similar in construction to that shown in FIGS. 1-4, 6) preferably may be separated from the ACM based ICM 110. Various efficient high-power-density voltage regulators are described in Vinciarelli, Buck-Boost DC-DC Switching Power Conversion, U.S. Pat. No. 6,788,033, issued Sep. 7, 2004, and U.S. Pat. No. 7,154,250, issued Dec. 26, 2006 (the "Buck-Boost patents"), both assigned to VLT, Inc. and incorporated in their entirety here by reference. In either variation, the regulator may perform power factor correction as described in the AC Adapter and Buck-Boost patents.

The ACM based ICM, which may be encapsulated as shown in FIGS. 1-4, 6 using the panel-molded process, may be contained in a package having, e.g., the following FIG. 4 dimensions: L2=0.886 inch (22.5 mm), W=0.253 inch (6.42 mm), and H=0.177 inch (4.50 mm). A heat spreading envelope (or sheath) formed by the contacts 122-1 to 122-4 (FIGS. 1-4) for the above package may be, e.g., 1.820 inch (46.23 mm) long (dimension L1), 0.317 inch (8.05 mm) wide (dimension X), and 0.240 inch (6.10 mm) high (dimension K) using 0.890 inch (22.6 mm) long contacts (dimension C) (dimensions shown in FIG. 3). For example, the body 116 of the in-line ACM module 110 may have the following dimensions shown in FIG. 1: 0.470 inch (11.94 mm) diameter (dimension D) circular fins 118, and 0.500 inch (12.70 mm) diameter (dimension D2) strain reliefs 113-1, 113-2, 1.625 inch (41.28 mm) long (dimension L3) finned portion, and 3.639 inch (92.43 mm) (dimension Z) overall length including strain reliefs. The total volume of the body 116 as described (exclusive of strain reliefs) may be 0.28 cubic-inches (4.59 cubic-cm). The in-line power conversion module 110 may have a conversion efficiency of 97% and exhibit a power density greater than 100 watts-per-cubic inch. It will be appreciated that the AC adapter 220, 220-2 may provide power density that is much higher than conventional solutions and enable manufacture of power adapters that are smaller, lighter, more efficient and easier to store and transport than prior-art devices.

B. Vehicular Power Systems

Figure 11:
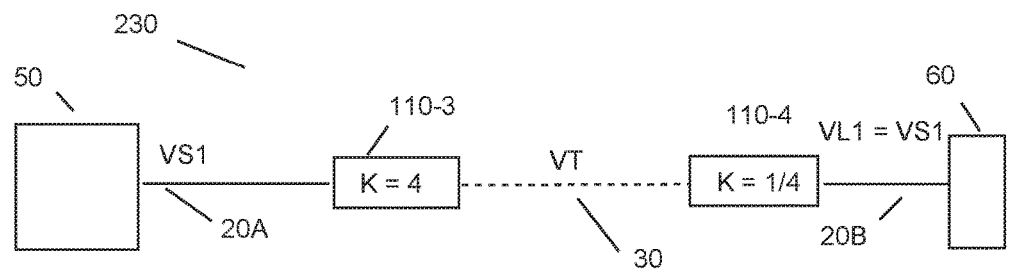
FIG. 11 shows a power system using two in-line converter modules.

In many vehicular environments, e.g. automotive and aircraft, the size, weight, and cost of wire harnesses are significant concerns for the power system architect. The ICM 110 may be advantageously deployed in such environments to reduce the size and cost of wire harnesses. Referring to FIG. 11, a power system 230 is shown including a unipolar power source 50 connected to deliver power via wire 20A at a voltage VS1 to the input of an ICM 110-3. ICM 110-3 delivers power at a voltage VT via bus or wire 30 to the input of a second ICM 110-4, which in turn supplies power at voltage VL1 to the load 60 via wire 20B. As shown in FIG. 11, the first ICM, 110-3, may provide step-up voltage transformation, e.g. $K=VT/VS1=4$ and the second ICM, 110-4, may provide step-down voltage transformation, e.g. $K=VL1/VT=¼$. As a result, the load voltage VL1 is essentially the same as the source voltage VS1, i.e. VL1=VS1. In automotive applications, the source 50 may be the vehicle's nominal 12 VDC battery or alternator, to which input wire harness 20A may be connected directly, e.g. via a fuse box, or indirectly via a connector (not shown) to an accessory power outlet, to provide power to the ICM 110. Because VT is greater than VS1 and VL1, a smaller gauge wire may be used for harness 30 between ICMs 110-3, 110-4 than would otherwise be required to carry the same power at the lower voltage. Minimizing the length of low voltage cable 20A, 20B may beneficially save weight, size, and cost in the system 230 over traditional power harnesses, without increasing I2R losses. By placing a DC-transformer based ICM 110 at each end of the harness assembly, each physically close to the source 50 and the load 60, the size, weight and losses in the intermediate harness 30 may be reduced.

Although the example of FIG. 11 describes a system 230 with substantially equal source and load voltages, VL1=VS1, and ICMs 110-3, 110-4 are shown having complementary voltage transformation ratios, the concept of stepping up or down at one or both ends of a harness may be beneficial in applications in which the source and load voltages are different. For example, ICM 110-4 may provide step-down greater than the reciprocal of the K factor in ICM 110-3, e.g. to supply power at voltages lower than the source, or vice versa. For example, an automotive system may use a K=4 for ICM 110-3 (VT=48V) near the source 50 and K=1/48 for ICM 110-4 near the load to supply the load with 1 VDC. Similarly, in electric cars or hybrid systems, where higher system voltages, e.g. 400 VDC, are available, the power system 230 may use a K=1/8 for ICM 110-3 near the source to step down from the high voltage to a safer voltage (VT=50V) and K=1/4 for ICM 110-4 near the load to supply the load with a nominal 12 VDC.

C. System Power Architectures

Figure 12:
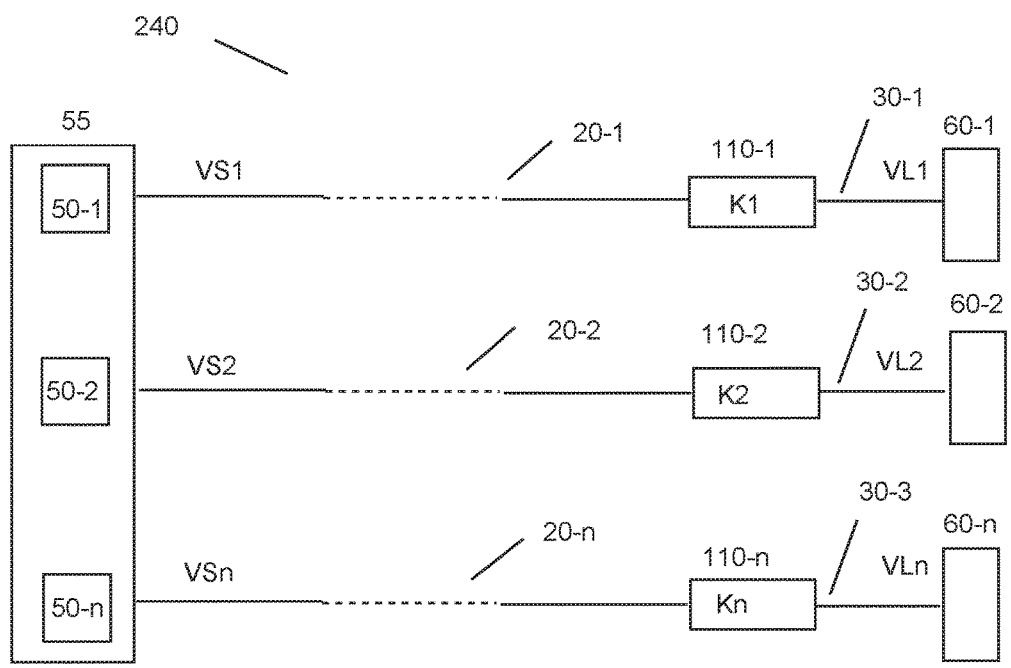
FIG. 12 shows a multi-output power system using a plurality of in-line converter modules.

Referring to FIG. 12, a multi-output power system 240 is shown having a centralized power source 55, which may include a plurality of individual sources 50-1, 50-2, 50-n, which may be regulators or other power conditioning devices. The centralized power source 55 may include supervisory circuitry (not shown) for sequencing the individual sources 50 during start up and shut down and providing telemetry to the system. As shown, DC Transformer based ICMs 110-1, 110-2, 110-n may be deployed in proximity to the respective loads 60-1, 60-2, 60-n providing step down voltage transformation in system 240 which accordingly may distribute relatively higher voltages, VS1, VS2, VSn via wire harnesses 20-1, 20-2, 20-n, respectively. Preferably, the connections 30-1, 30-2, 30-n between the ICM outputs and the respective loads 60-1, 60-2, 60-n may be kept relatively short to realize the savings in weight, size, and cost of higher voltage transmission while reducing power losses in the system. Each source, e.g. regulators 50-1, 50-2, 50-n, may control its respective output voltage, VS1, VS2, VSn, to be the appropriate multiple, 1/K1, 1/K2, 1/Kn of the voltage required by the loads. Portions of the power system 240 incorporate the Factorized Power Architecture described in the FPA patent or the NIBA architecture described in the NIBA application, or both to efficiently deliver power to multiple distributed loads.

In some applications, it may be desirable to establish communication, e.g. control, telemetry, auxiliary power, etc. between an ICM 110 and other parts of the system in which it is deployed. In such applications, the ICM 110 may be modified to include one or more signal connections (not shown) between the input-side wire harness 102, output-side wire harness 104, or both to facilitate communication with or between ICMs. For example, in Factorized Power Architecture portions of the system, a single conductor may be provided between the upstream regulator and a VTM-based ICM near the point of load to allow the VTM to communicate with or receive power from the upstream regulator, e.g. as described in Vinciarelli, Control Interface with Droop Compensation, U.S. Pat. No. 7,202,646, issued Apr. 10, 2007, assigned to VLT., Inc. and incorporated herein in its entirety (the "Adaptive Loop" patent). For example, in FIG. 11 ICM 110-3 may communicate through harness 20A with the upstream regulator (source 50) or through harness 30 with the downstream ICM 110-4 to provide feedback, telemetry, etc.; similarly in FIG. 12, ICMs 110-1 through 110-n may communicate through harnesses 20-1 through 20-n with their respective regulators 50-1 through 50-n. The additional conductor(s) may be used to supply power, and optionally a control signal, to the control circuitry of a DC Transformer (in an ICM) to allow it to operate from very low input voltages, typically to enable a controlled rise of the DC transformer output voltage with the rise of the voltage of the source 50 in applications in which the DC Transformer input is connected directly to a DC source, such as source 50.

A number of embodiments of the invention have been described. Nevertheless, it will be understood that various modifications may be made without departing from the spirit and scope of the invention. For example, a wide variety of converter topologies may be used in the ICM. FIGS. 1 through 7 illustrate ICMs based upon encapsulated power converters made using the Panel Mold process described in the Panel Mold application, Leadless PM application, and in the Barcode patent. It is understood that many alternate physical embodiments of the ICM based upon other power converter topologies and packages are possible. Furthermore, the system described above may supply power to loads 60 that include internal electronic circuitry, e.g., laptop computers, server boards, etc. which may include additional power conversion circuitry delivering additional voltages and functionality such as power factor correction within the load shown in the Figures.

The disclosure is described above with reference to drawings. These drawings illustrate certain details of specific embodiments that implement the systems, apparatus, and/or methods of the present disclosure. However, describing the disclosure with drawings should not be construed as imposing on the disclosure any limitations that may be present in the drawings. No claim element herein is to be construed as a "means plus function" element unless the element is expressly recited using the phrase "means for." Furthermore, no element, component or method step in the present disclosure is intended to be dedicated to the public, regardless of whether the element, component or method step is explicitly recited in the claims.

It should be noted that although the disclosure provided herein may describe a specific order of method steps, it is understood that the order of these steps may differ from what is described. Also, two or more steps may be performed concurrently or with partial concurrence. It is understood that all such variations are within the scope of the disclosure.

The foregoing description of embodiments of the disclosure have been presented for purposes of illustration and description. It is not intended to be exhaustive or to limit the disclosure to the precise form disclosed, and modifications and variations are possible in light of the above teachings or may be acquired from practice of the disclosure. The embodiments were chosen and described in order to explain the principles of the disclosure and its practical application to enable one skilled in the art to utilize the disclosure in various embodiments and with various modifications as are suited to the particular use contemplated.

What is claimed is:

1. An apparatus comprising:
   an in-line converter module assembly configured for cable-termination deployment, the in-line converter module assembly comprising:
   a first power conversion module including a module body having an input terminal adapted to accommodate an electrical connection to an input of the first power conversion module, and an output terminal adapted to accommodate an electrical connection to an output of the first power conversion module;
   the first power conversion module including circuitry adapted to convert power received from the input terminal at a unipolar input voltage, Vin, for delivery at the output terminal at a unipolar output voltage, Vo, at an essentially fixed voltage transformation ratio, K=Vo/Vin; and
   a strain relief mechanism mechanically secured to the in-line converter module assembly, the strain relief mechanism being configured to mechanically engage an electrical cable electrically connected to the input terminal or the output terminal of the first power conversion module, the strain relief mechanism mechanically securing the electrical cable to the in-line converter module assembly;

wherein the inline converter module assembly is adapted to be used as part of a wire harness that includes the electrical cable, wherein the electrical cable has a first end adapted for connection to electrical equipment and a second end electrically connected to the input terminal or output terminal of the first power conversion module, and wherein the wire harness is configured to provide one or both of DC voltage transformation and galvanic isolation in-line between at least one of (i) the electrical cable and the output terminal of the first power conversion module when the second end of the electrical cable is electrically connected to the input terminal of the first power conversion module, or (ii) the electrical cable and the input terminal of the first power conversion module when the second end of the electrical cable is electrically connected to the output terminal of the first power conversion module.

2. The apparatus of claim 1, further comprising:
an input cable having a first end and a second end; and
wherein the input terminal is adapted to form an electrical and mechanical connection to the second end of the input cable, and the first end of the input cable is electrically and mechanically connected to the electrical equipment;
and
wherein the strain relief mechanism is configured to mechanically engage the input cable;
wherein the in-line converter module assembly and the input cable together form the wire harness; and
wherein the wire harness provides power transmission and one or both of DC voltage transformation and galvanic isolation in-line between the first end of the input cable and the output terminal of the first power conversion module.

3. The apparatus of claim 1, further comprising an output cable having a first end and a second end; and
wherein the output terminal is adapted to form an electrical and mechanical connection to the first end of the output cable, and the second end of the output cable is electrically and mechanically connected to the electrical equipment wherein the strain relief mechanism is configured to mechanically engage the output cable;
wherein the in-line converter module assembly and the output cable together form the wire harness; and
wherein the wire harness provides power transmission and one or both of DC voltage transformation and galvanic isolation in-line between the input terminal of the first power conversion module and the second end of the output cable.

4. The apparatus of claim 1 further comprising:
a second power conversion module including a module body having an input terminal adapted to accommodate an electrical connection to an input of the second power conversion module, and an output terminal adapted to accommodate an electrical connection to an output of the second power conversion module;
the second power conversion module including circuitry adapted to convert power received from the input terminal at a unipolar input voltage, Vin, for delivery at the output terminal at a unipolar output voltage, Vo, at an essentially fixed voltage transformation ratio, K=Vo/Vin; and
a first cable having a first end electrically connected to the output terminal of the first power conversion module and a second end electrically connected to the input terminal of the second power conversion module;
wherein the apparatus is adapted to be used as part of the wire harness to provide one or both of DC voltage transformation and galvanic isolation in-line between the input terminal of the first power conversion module and the output terminal of the second power conversion module.

5. The apparatus of claim 4 wherein the first power conversion module provides voltage step-up and the second power conversion module provides voltage step-down.

6. The apparatus of claim 1, further comprising:
a connector having a first end and a second end; and
wherein the input terminal is configured to form an electrical and mechanical connection to the second end of the connector, and the first end of the connector is electrically and mechanically connected to an input power source;
wherein the strain relief mechanism is configured to mechanically engage the connector;
wherein the in-line converter module assembly and the connector together form the wire harness; and
wherein the wire harness provides power transmission and one or both of DC voltage transformation and galvanic isolation in-line between the first end of the connector and the output terminal of the first power conversion module.

7. The apparatus of claim 1, further comprising a connector configured to connect to the electrical cable and an input power source, the electrical cable having a first end electrically connected to the connector and a second end electrically connected to the input terminal of the first power conversion module,
wherein the strain relief mechanism is configured to mechanically engage the electrical cable;
wherein the in-line converter module assembly, the electrical cable, and the connector together form the wire harness;
wherein the wire harness provides power transmission and one or both of DC voltage transformation and galvanic isolation in-line between the first end of the connector and the output terminal of the first power conversion module, and
wherein the input power source comprises an AC source and the connector is adapted to mate with an AC outlet.

8. The apparatus of claim 7 wherein the connector further comprises a rectifier electrically connected to receive power from the AC source and deliver rectified power at the unipolar voltage to the input terminal of the first power conversion module via the electrical cable and wherein the connector is physically separated from the converter body by an electrical distance defined by the length of the electrical cable.

9. The apparatus of claim 6 wherein the connector is a plug having two or more conductive prongs.

10. The apparatus of claim 1 wherein the first power conversion module comprises a first pair of conductively plated holes adapted to receive input wires of the wire harness, and
a second pair of conductively plated holes adapted to receive mechanical fasteners for securing the first power conversion module to another module that comprises a load or is electrically coupled to a load.

11. The apparatus of claim 10 wherein the load comprises a second power conversion circuit that further comprises one or more outputs adapted to deliver power at one or more regulated output voltages.

12. The apparatus of claim 7 further comprising a second electrical cable having a first end connected to the output of the first power conversion module and a second end connected to the load, wherein the load comprises a second power conversion circuit having a controller for controlling the power factor of the power drawn from the output of the first power conversion circuit.

13. The apparatus of claim 1 wherein the module body further comprises a conductive member electrically connected to an input or output of the first power conversion module and being constructed and arranged to spread heat from the circuitry along a pre-defined region of the module body.

14. The apparatus of claim 13, comprising the electrical cable, in which the electrical cable is electrically connected to the input of the first power conversion module, the electrical cable is mechanically connected to the strain relief, and wherein the conductive member comprises a pair of conductive members connected between the electrical cable and the input and forming a heat spreading sheath around a selected portion of the circuitry.

15. The apparatus of claim 14, further comprising an output cable electrically connected to the output, and wherein the conductive member further comprises another conductive member connected between the output cable and the output and forming a heat spreading sheath around a selected portion of the circuitry.

16. The apparatus of claim 14 wherein the module body further comprises an electrically insulating covering surrounding the conductive members and a portion of the electrical cable.

17. The apparatus of claim 15 wherein the module body comprises an electrically insulating exterior molded around the conductive members, the first power conversion circuit, a portion of the electrical cable, and a portion of the output cable.

18. The apparatus of claim 1 wherein the module body further comprises one or more conductive members thermally connected to the circuitry and being constructed and arranged to spread heat from the circuitry along one or more pre-defined regions of the module body and an electrically insulating covering surrounding the conductive members and the circuitry.

19. The apparatus of claim 1 wherein the first power conversion module further comprises a transformer, a plurality of power switching elements connected to the transformer, and a switch controller adapted to operate the power switching elements in a series of converter operating cycles during which power received from the input terminal is converted for delivery to the output terminal via the transformer.

20. The apparatus of claim 1 wherein K is less than 1.

21. The apparatus of claim 20 wherein K is less than or equal to ¼.

22. The apparatus of claim 20, further comprising:
an input cable, having a first end and a second end, the first end of the input cable being electrically connected to a power regulator, and the second end of the input cable being electrically connected to the input terminal of the first power conversion module; and
an output cable having a first end and a second end, the first end of the output cable being electrically connected to the output terminal of the first power conversion module, and the second end of the output cable being electrically connected to a load;
wherein a current carrying capacity of the output cable is greater than a current carrying capacity of the input cable, wherein the strain relief mechanism mechanically secures the second end of the input cable or the first end of the output cable to the in-line converter module assembly, and
wherein the in-line converter module assembly, the input cable, and the output cable together form the wire harness.

23. The apparatus of claim 1, comprising:
a regulator having an output terminal and being configured to supply DC power at a controlled first voltage via the output terminal, and
the electrical cable, the first end of the electrical cable being electrically connected to the output terminal of the regulator, and the second end of the electrical cable being electrically connected to the input terminal of the first power conversion module;
wherein the electrical cable and the in-line converter module assembly together form the wire harness;
wherein the wire harness carries power from the output terminal of the regulator, and provides one or both of DC voltage transformation and galvanic isolation in-line between the first end of the electrical cable and the output terminal of the first power conversion module.

24. The apparatus of claim 23, wherein the first power conversion module is located at or near a point of load and the output terminal of the first power conversion module further comprises terminations adapted for mechanical and electrical connection to the load.

25. The apparatus of claim 24 wherein the terminations of the output terminal further comprise one or more conductive portions, each having a respective hole adaptive to be secured to the load.

26. The apparatus of claim 1 wherein the module assembly further comprises a housing surrounding the module body.

27. The apparatus of claim 1 wherein the module assembly further comprises an external surface at least a portion of which is defined by the module body.

28. An apparatus comprising:
a first power conversion module including a module body having an input opening adapted to accommodate an electrical connection to an input of the first power conversion module, an output opening adapted to accommodate an electrical connection to an output of the first power conversion module, and an internal space;
the first power conversion module including circuitry contained in the internal space and adapted to convert power received from the input at an input voltage, Vin, for delivery at the output at a unipolar output voltage, Vo, via a transformer at an essentially fixed voltage transformation ratio, K=Vo/Vin;
wherein the first power conversion module is adapted to be used as part of a wire harness to provide one or both of voltage transformation and galvanic isolation in-line between the input through the input opening and the output through the output opening,
wherein the module body further comprises a conductive member electrically connected to an input or output of the first power conversion module and being constructed and arranged to spread heat from the circuitry along a pre-defined region of the module body, and
wherein the input opening is adapted to accommodate a cable and the apparatus further comprises a first cable routed through the input opening and electrically connected to the input of the first power conversion module and wherein the conductive member comprises a pair of conductive members connected between the first cable and the input and forming a heat spreading sheath around a selected portion of the circuitry.

29. The apparatus of claim 28 wherein the output opening is adapted to accommodate a cable and the apparatus further comprises a second cable routed through the output opening and electrically connected to the output, and wherein the conductive member further comprises another conductive member connected between the second cable and the output and forming a heat spreading sheath around a selected portion of the circuitry.

30. The apparatus of claim 29 wherein the module body comprises an electrically insulating exterior molded around the conductive members, the first power conversion circuit and portions of the first and second cables.

31. The apparatus of claim 28 wherein the module body further comprises an electrically insulating covering surrounding the conductive members and a portion of the first cable.

32. The apparatus of claim 28 in which the module body comprises at least two terminals adapted to form high current connections.

33. The apparatus of claim 28 wherein:
the input terminal is adapted to accommodate a cable and the apparatus further comprises a first cable routed through the input opening and electrically connected to the input of the first power conversion module;
the output opening comprises an electrical connector having terminals connected to the output; and
the apparatus is adapted to be used at an end of the wire harness to provide one or both of voltage transformation and galvanic isolation in-line between the first cable and the connector.

34. The apparatus of claim 28 wherein:
the input opening comprises an electrical connector having terminals connected to the input;
the output opening is adapted to accommodate a cable and the apparatus further comprises a first cable routed through the output opening and electrically connected to the output of the first power conversion module; and
the apparatus is adapted to be used at an end of the wire harness to provide one or both of voltage transformation and galvanic isolation in-line between the first cable and the connector.

35. The apparatus of claim 28 wherein the input opening and output opening each comprises an electrical connector having terminals connected to its respective input or output; and
the apparatus is adapted to be used at an end of the wire harness to provide one or both of voltage transformation and galvanic isolation in-line between the input connector and the output connector.

36. The apparatus of claim 28 wherein:
the input opening is adapted to accommodate a cable and the apparatus further comprises a first cable routed through the input opening and electrically connected to the input of the first power conversion module;
the output opening is adapted to accommodate a cable and the apparatus further comprises a second cable routed through the output opening and electrically connected to the output of the first power conversion module; and
the apparatus is adapted to be used in the wire harness to provide one or both of voltage transformation and galvanic isolation in-line between the first cable and the second cable.

37. The apparatus of claim 28 further comprising:
a second power conversion module including a module body having an input opening adapted to accommodate an electrical connection to an input of the second power conversion module, an output opening adapted to accommodate an electrical connection to an output of the second power conversion module, and an internal space;
the second power conversion module including circuitry contained in the internal space and adapted to convert power received from the input at an input voltage, Vin, for delivery at the output terminal at a unipolar output voltage, Vo, via a transformer at an essentially fixed voltage transformation ratio, K=Vo/Vin;
a first cable having a first end electrically connected to the output of the first power conversion module and a second end electrically connected to the input of the second power conversion module;
wherein the apparatus is adapted to be used as part of the wire harness to provide one or both of voltage transformation and galvanic isolation in-line between the input opening of the first conversion module and the output opening of the second power conversion module.

38. The apparatus of claim 37 wherein the first power conversion module provides voltage step-up and the second power conversion module provides voltage step-down.

39. An apparatus comprising:
a first power conversion module including a module body having an input opening adapted to accommodate an electrical connection to an input of the first power conversion module, an output opening adapted to accommodate an electrical connection to an output of the first power conversion module, and an internal space;
the first power conversion module including circuitry contained in the internal space and adapted to convert power received from the input at an input voltage, Vin, for delivery at the output at a unipolar output voltage, Vo, via a transformer at an essentially fixed voltage transformation ratio, K=Vo/Vin; and
a connector configured to connect to an input power source and a first cable having a first end electrically connected to the connector and a second end electrically connected to the input of the first power conversion module;
wherein the first power conversion module is adapted to be used as part of a wire harness to provide one or both of voltage transformation and galvanic isolation in-line between the input through the input opening and the output through the output opening,
wherein the apparatus is adapted for use as an in-line cable to connect a load to the input power source providing voltage transformation, galvanic isolation, or both there between;
wherein the input power source comprises an AC source and the connector is adapted to mate with an AC outlet; and
wherein the connector further comprises a rectifier electrically connected to receive power from the AC source and deliver rectified power at a unipolar voltage to the input of the first power conversion module via the first cable and wherein the connector is physically separated from the converter body by an electrical distance defined by the length of the first cable.

40. The apparatus of claim 39 wherein:
the input opening is adapted to accommodate a cable and the apparatus further comprises a first cable routed through the input opening and electrically connected to the input of the first power conversion module;

the output opening comprises an electrical connector having terminals connected to the output; and the apparatus is adapted to be used at an end of the wire harness to provide one or both of voltage transformation and galvanic isolation in-line between the first cable and the connector.

41. The apparatus of claim 39 wherein:

the input opening comprises an electrical connector having terminals connected to the input;

the output opening is adapted to accommodate a cable and the apparatus further comprises a first cable routed through the output opening and electrically connected to the output of the first power conversion module; and the apparatus is adapted to be used at an end of the wire harness to provide one or both of voltage transformation and galvanic isolation in-line between the first cable and the connector.

42. The apparatus of claim 39 wherein the input opening and output opening each comprises an electrical connector having terminals connected to its respective input or output; and the apparatus is adapted to be used at an end of the wire harness to provide one or both of voltage transformation and galvanic isolation in-line between the input connector and the output connector.

43. The apparatus of claim 39 wherein:

the input opening is adapted to accommodate a cable and the apparatus further comprises a first cable routed through the input opening and electrically connected to the input of the first power conversion module;

the output opening is adapted to accommodate a cable and the apparatus further comprises a second cable routed through the output opening and electrically connected to the output of the first power conversion module; and the apparatus is adapted to be used in the wire harness to provide one or both of voltage transformation and galvanic isolation in-line between the first cable and the second cable.

44. The apparatus of claim 39, further comprising:

a second power conversion module including a module body having an input opening adapted to accommodate an electrical connection to an input of the second power conversion module, an output opening adapted to accommodate an electrical connection to an output of the second power conversion module, and an internal space;

the second power conversion module including circuitry contained in the internal space and adapted to convert power received from the input at an input voltage, Vin, for delivery at the output terminal at a unipolar output voltage, Vo, via a transformer at an essentially fixed voltage transformation ratio, K=Vo/Vin;

a first cable having a first end electrically connected to the output of the first power conversion module and a second end electrically connected to the input of the second power conversion module;

wherein the apparatus is adapted to be used as part of the wire harness to provide one or both of voltage transformation and galvanic isolation in-line between the input opening of the first conversion module and the output opening of the second power conversion module.

45. The apparatus of claim 44 wherein the first power conversion module provides voltage step-up and the second power conversion module provides voltage step-down.

46. The apparatus of claim 39 wherein the connector is a plug having two or more conductive prongs.

47. The apparatus of claim 39 further comprising:

a first cable routed through the input opening and electrically connected to the input of the first power conversion module, and a second cable having a first end routed through the output opening and electrically connected to the output of the first power conversion module and a second end connected to the load, wherein the load comprises a second power conversion circuit.

48. The apparatus of claim 47 wherein the second power conversion circuit further comprises one or more outputs adapted to deliver power at one or more regulated output voltages.

49. The apparatus of claim 39 further comprising a second cable having a first end connected to the output of the first power conversion module and a second end connected to the load, wherein the load comprises a second power conversion circuit having a controller for controlling the power factor of the power drawn from the output of the first power conversion circuit.

50. The apparatus of claim 39 wherein the module body further comprises a conductive member electrically connected to an input or output of the first power conversion module and being constructed and arranged to spread heat from the circuitry along a pre-defined region of the module body.

* * * * *

UNITED STATES PATENT AND TRADEMARK OFFICE
CERTIFICATE OF CORRECTION

PATENT NO. : 10,284,106 B1
APPLICATION NO. : 15/174083
DATED : May 7, 2019
INVENTOR(S) : Patrizio Vinciarelli and Andrew T. D'Amico It is certified that error appears in the above-identified patent and that said Letters Patent is hereby corrected as shown below:

In the Specification

Column 8, Line 8, delete "US 2012/034795" and insert -- PCT/US2012/037495 --.

Signed and Sealed this
Seventh Day of March, 2023

Katherine Kelly Vidal
Director of the United States Patent and Trademark Office